US012579349B2

(12) United States Patent
Li et al.

(10) Patent No.: US 12,579,349 B2
(45) Date of Patent: Mar. 17, 2026

(54) METHOD AND APPARATUS FOR AUTOMATIC EXPANSION OF STORAGE ARRAY, DEVICE AND MEDIUM

(71) Applicant: CHANGXIN MEMORY TECHNOLOGIES, INC., Hefei City (CN)

(72) Inventors: Minghao Li, Hefei (CN); Li Bai, Hefei (CN); Chuanjiang Chen, Hefei (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 841 days.

(21) Appl. No.: 17/954,468

(22) Filed: Sep. 28, 2022

(65) Prior Publication Data

US 2023/0027755 A1    Jan. 26, 2023

Related U.S. Application Data

(63) Continuation of application No. PCT/CN2022/087610, filed on Apr. 19, 2022.

(30) Foreign Application Priority Data

Dec. 21, 2021    (CN) .......................... 202111574484.7

(51) Int. Cl.
*G06F 30/323* (2020.01)
(52) U.S. Cl.
CPC ................................. *G06F 30/323* (2020.01)
(58) Field of Classification Search
CPC .................................................... G06F 30/323

USPC .......................................................... 716/103
See application file for complete search history.

(56) References Cited

U.S. PATENT DOCUMENTS

| | | | | |
|---|---|---|---|---|
| 11,487,454 B2* | 11/2022 | Nishikawa | ............. | G06F 3/0679 |
| 12,245,429 B2* | 3/2025 | Petti | ........................ | H10B 43/40 |
| 2003/0145167 A1* | 7/2003 | Tomita | ................... | G06F 3/0689 |
| | | | | 711/113 |
| 2004/0184302 A1 | 9/2004 | Shirahama et al. | | |

(Continued)

FOREIGN PATENT DOCUMENTS

| | | |
|---|---|---|
| CN | 1534682 A | 10/2004 |
| CN | 104205227 A | 12/2014 |

(Continued)

*Primary Examiner* — Suchin Parihar
(74) *Attorney, Agent, or Firm* — Syncoda LLC; Feng Ma

(57) ABSTRACT

A method for automatic expansion of a storage array includes: acquiring a word-line total number and bit-line total number of a target expanded storage array; calculating a translation amount of a translation array in a translation direction according to the word-line total number and the bit-line total number, a word-line total number and bit-line total number of the translation array and a preset translation rule, and calculating a number of repetitions of a repetition array in a repetition direction according to the translation amount, a word-line total number and bit-line total number of the repetition array and a preset repetition rule; and controlling at least part of the translation array and at least part of the repetition array to translate the translation amount along the translation direction and controlling the repetition array to repeat for the number of repetitions along the repetition direction to obtain the target expanded storage array.

20 Claims, 12 Drawing Sheets

Acquire a total number of word lines of a target expanded storage array and a total number of bit lines of the target expanded storage array — S110

Calculate a translation amount of a translation array in a translation direction according to the total number of word lines of the target expanded storage array, the total number of bit lines of the target expanded storage array, a total number of word lines of the translation array, a total number of bit lines of the translation array, and a preset translation rule, and calculate a number of repetitions of a repetition array in a repetition direction according to the translation amount, a total number of word lines of the repetition array, a total number of bit lines of the repetition array, and a preset repetition rule — S120

Control at least part of the translation array and at least part of the repetition array to translate by a corresponding translation amount along the translation direction, and controlling the repetition array to repeat for a corresponding number of repetitions along the repetition direction, to obtain the target expanded storage array — S130

(56)     References Cited

U.S. PATENT DOCUMENTS

| | | | |
|---|---|---|---|
| 2013/0258751 A1 | 10/2013 | Toops et al. | |
| 2016/0085627 A1* | 3/2016 | Marukame | H03M 13/2906 |
| | | | 714/764 |
| 2019/0034348 A1* | 1/2019 | Haswell | G06F 12/1009 |
| 2021/0173559 A1* | 6/2021 | Nishikawa | G11C 16/14 |
| 2022/0238551 A1* | 7/2022 | Petti | G11C 11/223 |
| 2024/0420762 A1* | 12/2024 | Kersting | G11C 13/0026 |
| 2025/0199692 A1* | 6/2025 | Denysyev | G06F 3/0631 |

FOREIGN PATENT DOCUMENTS

| | | |
|---|---|---|
| CN | 106649894 A | 5/2017 |
| CN | 111933200 A | 11/2020 |

\* cited by examiner

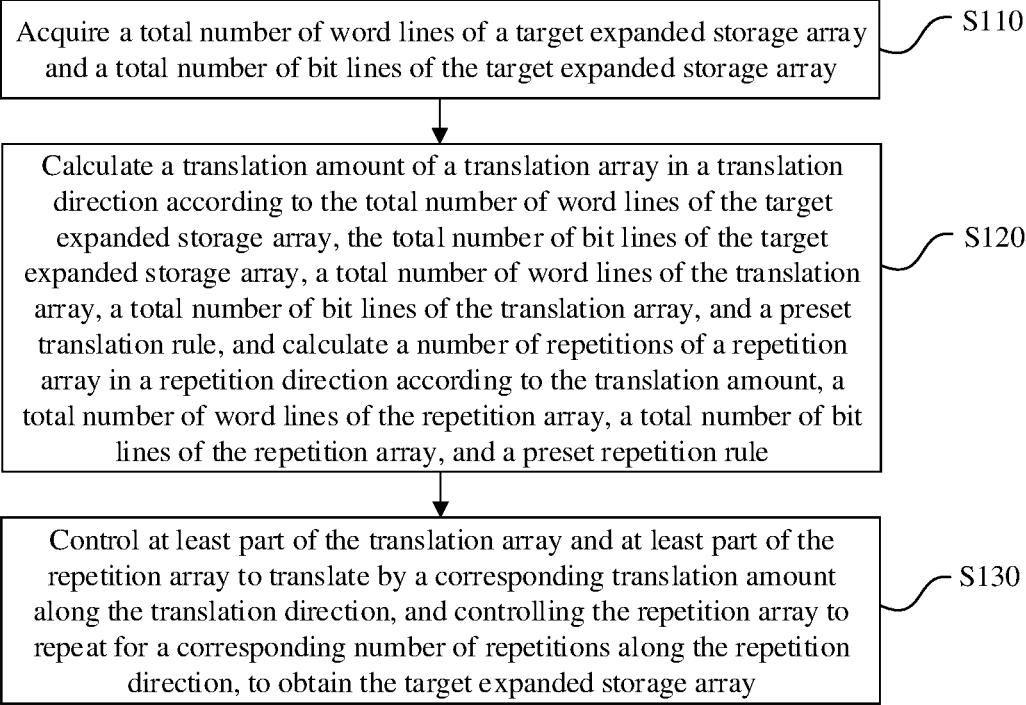

Acquire a total number of word lines of a target expanded storage array and a total number of bit lines of the target expanded storage array — S110

Calculate a translation amount of a translation array in a translation direction according to the total number of word lines of the target expanded storage array, the total number of bit lines of the target expanded storage array, a total number of word lines of the translation array, a total number of bit lines of the translation array, and a preset translation rule, and calculate a number of repetitions of a repetition array in a repetition direction according to the translation amount, a total number of word lines of the repetition array, a total number of bit lines of the repetition array, and a preset repetition rule — S120

Control at least part of the translation array and at least part of the repetition array to translate by a corresponding translation amount along the translation direction, and controlling the repetition array to repeat for a corresponding number of repetitions along the repetition direction, to obtain the target expanded storage array — S130

FIG. 1

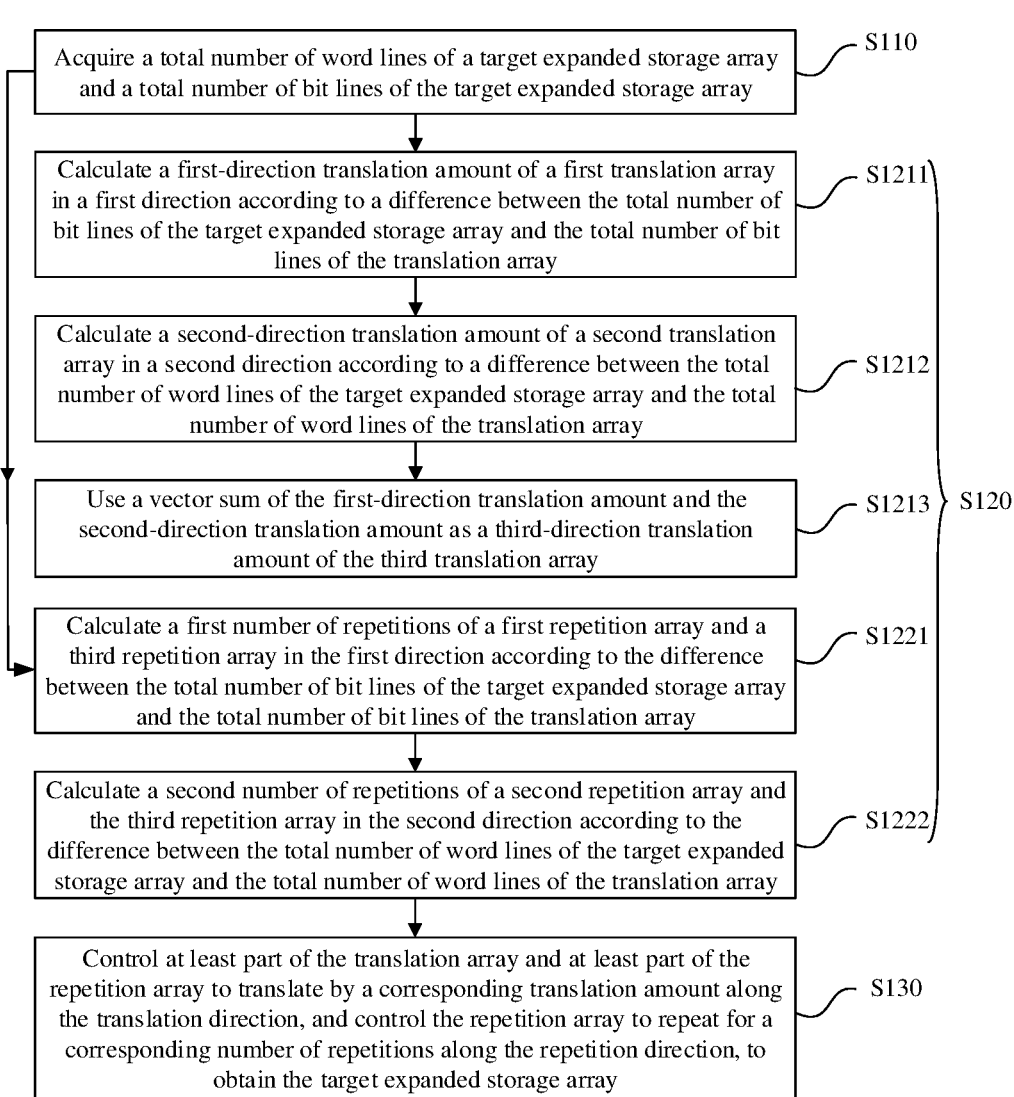

Acquire a total number of word lines of a target expanded storage array and a total number of bit lines of the target expanded storage array ⟶ S110

Calculate a first-direction translation amount of a first translation array in a first direction according to a difference between the total number of bit lines of the target expanded storage array and the total number of bit lines of the translation array ⟶ S1211

Calculate a second-direction translation amount of a second translation array in a second direction according to a difference between the total number of word lines of the target expanded storage array and the total number of word lines of the translation array ⟶ S1212

Use a vector sum of the first-direction translation amount and the second-direction translation amount as a third-direction translation amount of the third translation array ⟶ S1213

S120

Calculate a first number of repetitions of a first repetition array and a third repetition array in the first direction according to the difference between the total number of bit lines of the target expanded storage array and the total number of bit lines of the translation array ⟶ S1221

Calculate a second number of repetitions of a second repetition array and the third repetition array in the second direction according to the difference between the total number of word lines of the target expanded storage array and the total number of word lines of the translation array ⟶ S1222

Control at least part of the translation array and at least part of the repetition array to translate by a corresponding translation amount along the translation direction, and control the repetition array to repeat for a corresponding number of repetitions along the repetition direction, to obtain the target expanded storage array ⟶ S130

FIG. 2

METHOD AND APPARATUS FOR AUTOMATIC EXPANSION OF STORAGE ARRAY, DEVICE AND MEDIUM

CROSS-REFERENCE TO RELATED APPLICATIONS

This application is a continuation of International Application No. PCT/CN2022/087610, filed on Apr. 19, 2022, which claims priority to Chinese Patent Application No. 202111574484.7, filed to the China Patent Office on Dec. 21, 2021 and entitled "METHOD AND APPARATUS FOR AUTOMATIC EXPANSION OF STORAGE ARRAY, DEVICE AND MEDIUM". International Application No. PCT/CN2022/087610 and Chinese Patent Application No. 202111574484.7 are incorporated herein by reference in their entireties.

BACKGROUND

With rapid development of the manufacturing process of integrated circuits, the market has higher and higher requirements for the storage capacity of semiconductor storage products, which puts forward higher requirements for the production efficiency and quality of semiconductor storage products.

For a traditional storage array, the shape and size of the storage array needs to be planned according to the storage capacity requirements and basic storage cell structure, and then the planned storage array is built according to the word line size and bit line size. How to efficiently build the planned storage array becomes one of the urgent technical problems to be solved in the process of further improving the production efficiency of semiconductor storage products.

SUMMARY

The disclosure relates to the technical field semiconductor manufacturing, and in particular, to a method for automatic expansion of a storage array, a computer device and a non-transitory computer-readable storage medium.

According to some embodiments, an aspect of the disclosure provides a method for automatic expansion of a storage array, including: acquiring a total number of word lines of a target expanded storage array and a total number of bit lines of the target expanded storage array; calculating a translation amount of a translation array in a translation direction according to the total number of word lines, the total number of bit lines, a total number of word lines of the translation array, a total number of bit lines of the translation array, and a preset translation rule, and calculating a number of repetitions of a repetition array in a repetition direction according to the translation amount, a total number of word lines of the repetition array, a total number of bit lines of the repetition array, and a preset repetition rule; and controlling at least part of the translation array and at least part of the repetition array to translate by the translation amount along the translation direction, and controlling the repetition array to repeat for the number of repetitions along the repetition direction, to obtain the target expanded storage array.

According to some embodiments, yet another aspect of the disclosure provides a computer device, including a memory and a processor, the memory storing a computer programs executable on the processor. The computer program, when executed by the processor, causes the processor to implement: acquiring a total number of word lines of a target expanded storage array and a total number of bit lines of the target expanded storage array; calculating a translation amount of a translation array in a translation direction according to the total number of word lines, the total number of bit lines, a total number of word lines of the translation array, a total number of bit lines of the translation array, and a preset translation rule, and calculating a number of repetitions of a repetition array in a repetition direction according to the translation amount, a total number of word lines of the repetition array, a total number of bit lines of the repetition array, and a preset repetition rule; and controlling at least part of the translation array and at least part of the repetition array to translate by the translation amount along the translation direction, and controlling the repetition array to repeat for the number of repetitions along the repetition direction, to obtain the target expanded storage array.

According to some embodiments, still another aspect of the disclosure provides a non-transitory computer-readable storage medium having stored thereon a computer program that, when executed by a processor, causes the processor to implement: acquiring a total number of word lines of a target expanded storage array and a total number of bit lines of the target expanded storage array; calculating a translation amount of a translation array in a translation direction according to the total number of word lines, the total number of bit lines, a total number of word lines of the translation array, a total number of bit lines of the translation array, and a preset translation rule, and calculating a number of repetitions of a repetition array in a repetition direction according to the translation amount, a total number of word lines of the repetition array, a total number of bit lines of the repetition array, and a preset repetition rule; and controlling at least part of the translation array and at least part of the repetition array to translate by the translation amount along the translation direction, and controlling the repetition array to repeat for the number of repetitions along the repetition direction, to obtain the target expanded storage array.

Details of one or more embodiments of the disclosure are provided in the accompanying drawings and descriptions below. Other features, objectives, and advantages of the disclosure become apparent from the description, the drawings and the claims.

BRIEF DESCRIPTION OF THE DRAWINGS

To describe the technical solutions in the embodiments of the disclosure more clearly, the accompanying drawings required for describing the embodiments are briefly described hereinafter. Apparently, the accompanying drawings in the following description show merely some embodiments of the disclosure, and those skilled in the art may obtain accompanying drawings of other embodiments from these accompanying drawings without creative efforts.

FIG. 1 illustrates a schematic flowchart of a method for automatic expansion of a storage array according to an embodiment of the disclosure.

FIG. 2 illustrates a schematic flowchart of a method for automatic expansion of a storage array according to another embodiment of the disclosure.

DETAILED DESCRIPTION

Figure 3A:
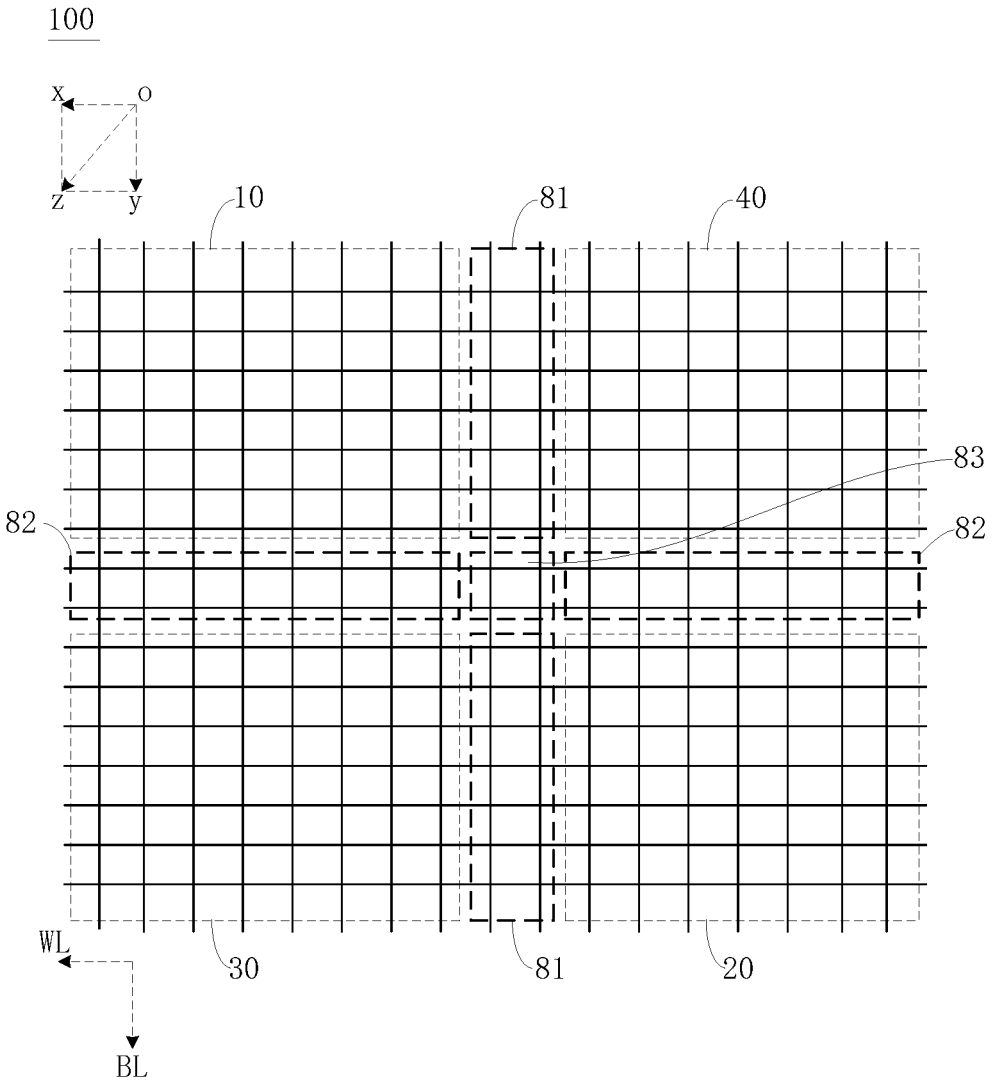
FIG. 3A illustrates a schematic top view of an initial array according to an embodiment of the disclosure.

To facilitate understanding of the disclosure, the disclosure will be described more fully hereinafter with reference to the related drawings. Better embodiments of the disclosure are shown in the accompanying drawings. However, the disclosure may be embodied in many different forms and is not limited to the embodiments described herein. Rather, these embodiments are provided for a thorough and complete understanding of the content of the disclosure.

Unless otherwise defined, all technical and scientific terms used herein have the same meanings as commonly understood by those skilled in the art to which the disclosure belongs. The terms used herein in the description of the disclosure are merely intended to describe specific embodiments, rather than limiting the disclosure. As used herein, the term "and/or" includes any and all combinations of one or more of the associated listed items.

In a case of using "including", "having", and "comprising" described herein, unless an explicit qualifying language is used, such as "only", "consisting of," etc., another component may also be added. Unless mentioned to the contrary, singular terms may include the plural and should not be construed as only one.

It may be understood that although the terms "first", "second" and the like may be used for describing various elements herein, these elements are not limited by these terms. These terms are merely used for distinguishing one element from another element. For example, a first element may be termed a second element, and similarly, a second element may be termed a first element, without departing from the scope of the disclosure.

In the description of the disclosure, unless otherwise explicitly specified and defined, the terms such as "mounted", "connected", and "connection" should be understood in broad sense, for example, the connection may be a fixed connection, a detachable connection, or an integral connection; or the connection may be a direct connection, an indirect connection through an intermediary, or internal communication between two elements. Those skilled in the art may understand specific meanings of the terms in the disclosure according to specific situations.

It is to be noted that in the disclosure, the term "distance" between two adjacent word lines refers to a distance between center points of two adjacent word lines, and the term "average distance" of two adjacent word lines refers to an average value of the distances between the center points of two adjacent word lines.

Because a basic storage cell structure includes complexly arranged multi-layer semiconductor layers, and a grid area presented in the storage array is very small, it is easy to cause errors such as unclear boundaries or coordinate offsets when the basic storage cell needs to be repeated in the process of manually expanding the storage array. In addition, the manual expansion efficiency is low, which seriously affects the production efficiency and quality of semiconductor storage products.

Referring to FIG. 1, in one embodiment of the disclosure, provided is a method for automatic expansion of a storage array includes the following steps.

In step S110, a total number of word lines of a target expanded storage array and a total number of bit lines of the target expanded storage array are acquired.

In step S120, a translation amount of a translation array in a translation direction is calculated according to the total number of word lines of the target expanded storage array, the total number of bit lines of the target expanded storage array, a total number of word lines of the translation array, a total number of bit lines of the translation array, and a preset translation rule, and a number of repetitions of a repetition array in a repetition direction is calculated according to the translation amount, a total number of word lines of the repetition array, a total number of bit lines of the repetition array, and a preset repetition rule.

In step S130, at least part of the translation array and at least part of the repetition array are controlled to translate by a corresponding translation amount along the translation direction, and the repetition array is controlled to repeat for a corresponding number of repetitions along the repetition direction, to obtain a target expanded storage array.

Specifically, still referring to FIG. 1, after the total number of word lines of the target expanded storage array and the total number of bit lines of the target expanded storage array are acquired, the target expanded storage array is automatically generated according to the total number of word lines of the target expanded storage array, the total number of bit lines of the target expanded storage array, the total number of word lines of the translation array, and the total number of bit lines of the translation array, so that automatically and efficiently generating the target expanded storage array according to the required storage capacity is implemented, to avoid errors such as unclear boundaries or coordinate offsets in the process of manually expanding the storage array, thereby effectively improving the production efficiency and quality of semiconductor storage products.

As an example, referring to FIG. 2, the translation array includes a first translation array defined to translate in a first direction, a second translation array defined to translate in a second direction, and a third translation array defined to translate in the first direction and the second direction. The step of calculating a translation amount of a translation array in a translation direction includes the following steps.

In step S1211, a first-direction translation amount of the first translation array in the first direction is calculated according to a difference between the total number of bit lines of the target expanded storage array and the total number of bit lines of the translation array.

In step S1212, a second-direction translation amount of the second translation array in the second direction is calculated according to a difference between the total number of word lines of the target expanded storage array and the total number of word lines of the translation array.

In step S1213, a vector sum of the first-direction translation amount and the second-direction translation amount is used as a third-direction translation amount of the third translation array.

Specifically, it may be set that the first direction is consistent with an extension direction of word lines, and the second direction is consistent with an extension direction of bit lines. By controlling the first translation array and part of the repetition array to translate by the first-direction translation amount along the first direction, controlling the second translation array and part of the repetition array to translate by the second-direction translation amount along the second direction, and controlling the third translation array to translate by the third-direction translation amount along a vector sum direction of the first direction and the second direction, it is realized that a target expanded storage array including a blank region is obtained by translation according to at least part of the translation array and at least part of the repetition array, so that the blank region can be accurately filled by repeating the repetition array to obtain the target expanded storage array.

More specifically, the shape and size of the translation array and the shape and size of the repetition array may be determined according to the expansion requirements of the actual target expanded storage array, such as special structures or inherent defects in the storage array. Then a translation amount of a translation array in a translation direction is calculated according to the total number of word lines of the target expanded storage array, the total number of bit lines of the target expanded storage array, a total number of word lines of the translation array, a total number of bit lines of the translation array, and a preset translation rule, and a number of repetitions of a repetition array in a repetition direction is calculated according to the translation amount, a total number of word lines of the repetition array, a total number of bit lines of the repetition array, and a preset repetition rule. After controlling at least part of the translation array and at least part of the repetition array to translate by a corresponding translation amount along the translation direction, the repetition array is controlled to repeat for the number of repetitions along the repetition direction, to obtain a target expanded storage array.

As an example, still referring to FIG. 2, the step of calculating a translation amount of a translation array in a translation direction further includes: determining a word line pitch and a bit line pitch of the storage array, where the word line pitch is an average distance between two adjacent word lines, and the bit line pitch is an average distance between two adjacent bit lines; and calculating the first-direction translation amount stretch_x and the second-direction translation amount stretch_y according to the following formulae:

$$\text{stretch\_}x=(N\text{bitline}-N\text{corner}b)*\text{bitline\_pitch; and}$$

$$\text{stretch\_}y=(N\text{wordline}-N\text{corner}w)*\text{wordlinepitch;}$$

in the formulae above, Nwordline is the total number of word lines of the target expanded storage array, Ncornerw is the total number of word lines of the translation array, Nbitline is the total number of bit lines of the target expanded storage array, Ncornerb is the total number of bit lines of the translation array, wordline_pitch is the word line pitch, and bitline_pitch is the bit line pitch.

As an example, after controlling at least part of the translation array and at least part of the repetition array to translate by a corresponding translation amount along the translation direction, the repetition array is controlled to repeat for a corresponding number of repetitions along the repetition direction, so that after the target expanded storage array including the blank region is obtained by translation according to at least part of the translation array and at least part of the repetition array, the target expanded storage array is obtained by repeating the repetition array to fill the blank region, so as to avoid errors such as boundary overlap or coordinate offsets in the target expanded storage array.

As an example, still referring to FIG. 2, the repetition array includes a first repetition array to be repeated in the first direction, a second repetition array to be repeated in the second direction, and a third repetition array to be repeated in a vector sum direction of the first direction and the second direction. The step of calculating a number of repetitions of a repetition array in a repetition direction further includes the following steps.

In step S1221, a first number of repetitions of the first repetition array and the third repetition array in the first direction is calculated according to the difference between the total number of bit lines of the target expanded storage array and the total number of bit lines of the translation array.

In step S1222, a second number of repetitions of the second repetition array and the third repetition array in the second direction is calculated according to the difference between the total number of word lines of the target expanded storage array and the total number of word lines of the translation array.

Specifically, after translating according to at least part of the translation array and at least part of the repetition array to obtain the target expanded storage array including the blank region, the number of repetitions of the repetition array is calculated according to the size of the blank region and the size of the repetition array, to implement intelligent precise filling of the blank region, thereby avoiding errors such as boundary overlap or coordinate offsets in the target expanded storage array.

As an example, the calculating the first number of repetitions and the second number of repetitions further includes: determining a number of bit lines Nb in the first repetition array and a number of word lines Nw in the second repetition array; and calculating the first number of repetitions repetition_x and the second number of repetitions repetition_y according to the following formulae:

$$\text{repetition\_}x=((N\text{rbitline}-N\text{corner}b)/Nb)-1; \text{ and}$$

$$\text{repetition\_}y=((N\text{rwordline}-N\text{corner}w)/Nw)-1;$$

in the formulae above, Nrwordline is the total number of word lines of the target expanded storage array, Nrbitline is the total number of bit lines of the target expanded storage array, Ncornerw is the total number of word lines of the translation array, and Ncornerb is the total number of bit lines of the translation array.

Figure 3B:
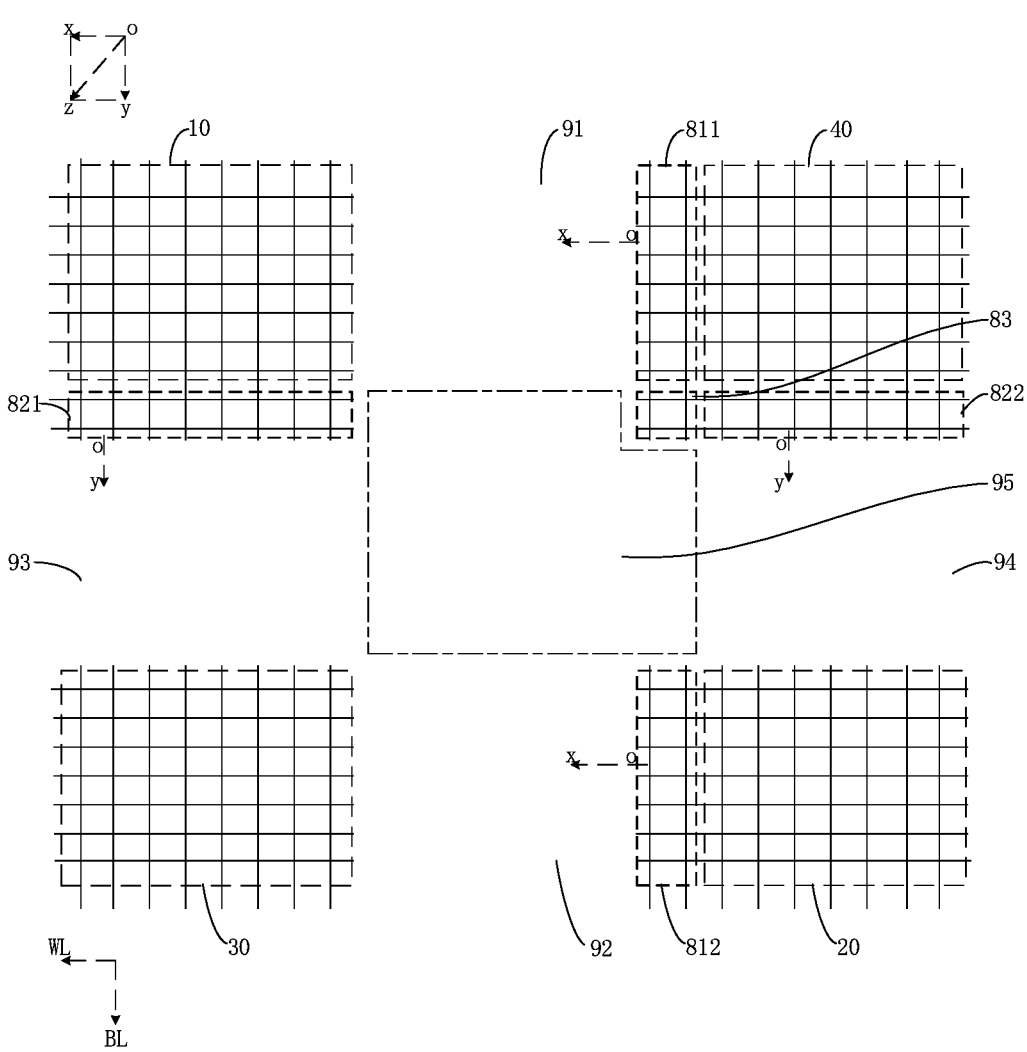
FIG. 3B illustrates a schematic top view of the outline of a target expanded storage array according to an embodiment of the disclosure.

As an example, referring to FIG. 3A and FIG. 3B, the translation array is a corner array of an initial array 100. The translation array includes a first translation array 10, a second translation array 20, a third translation array 30, and a fourth translation array 40. The repetition array includes a first repetition array 81, a second repetition array 82, and a third repetition array 83. The first translation array 10, the second translation array 20, the third translation array 30, the fourth translation array 40, the first repetition array 81, the second repetition array 82, and the third repetition array 83 form the initial array 100. That is, the translation array and the repetition array together form the initial array 100. The first translation array 10 is defined to translate in the first direction ox, the second translation array 20 is defined to translate in the second direction oy, and the third translation array 30 is defined to translate in the third direction oz. The first repetition array 81 is to be repeated in the first direction ox, the second repetition array 82 is to be repeated in the second direction oy, and the third repetition array 83 is to be repeated in the third direction oz. The third direction oz is a vector sum of the first direction ox and the second direction oy, and the vector sum direction may include a plurality of directions between the first direction ox and the second direction oy. The first repetition array 81 includes a first upper repetition array 811 and a first lower repetition array 812 located on opposite sides of the third repetition array 83. The second repetition array 82 includes a second left repetition array 821 and a second right repetition array 822 located on opposite sides of the third repetition array 83. The first upper repetition array 811 is located between the first translation array 10 and the fourth translation array 40. The first lower repetition array 812 is located between the second translation array 20 and the third translation array 30. The second left repetition array 821 is located between the first translation array 10 and the third translation array 30. The second right repetition array 822 is located between the second translation array 20 and the fourth translation array 40.

In FIG. 3A, the first translation array 10, the second translation array 20, the third translation array 30, and the fourth translation array 40 are corner arrays of the target expanded storage array. After the first-direction translation amount, the second-direction translation amount, and the third-direction translation amount are calculated according to the translation amount calculation formulae provided above, the first translation array 10 and the second left repetition array 821 can be controlled to translate by the first-direction translation amount along the first direction ox, the second translation array 20 and the first lower repetition array 812 can be controlled to translate by the second-direction translation amount along the second direction oy, and the third translation array 30 can be controlled to translate by the third-direction translation amount along the third direction oz, to obtain the target expanded storage array including a blank region as shown in FIG. 3B. The third-direction translation amount is the vector sum of the first-direction translation amount and the second-direction translation amount. The first direction ox may be set to be consistent with an extension direction (WL) of word lines, and the second direction oy may be set to be consistent with an extension direction (BL) of bit lines.

Figure 4A:
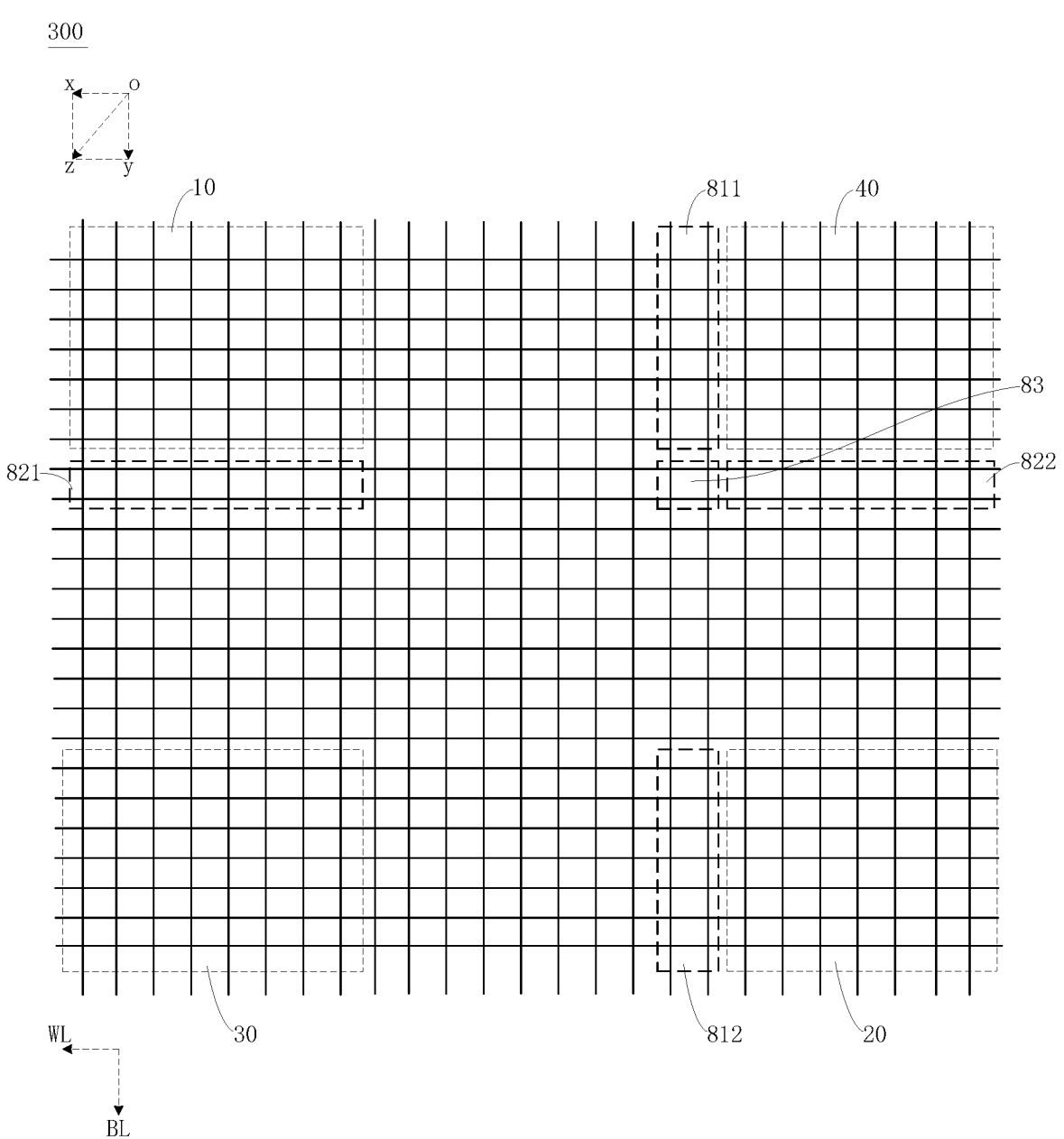
FIG. 4A illustrates a schematic top view of a target expanded storage array according to an embodiment of the disclosure.

Furthermore, referring to FIG. 3B and FIG. 4A, after the first number of repetitions and the second number of repetitions are calculated according to the repetition number calculation formula above, the first upper repetition array 811 is controlled to be repeated for the first number of repetitions in the first direction ox to fill the first blank region 91 located between the first translation array 10 and the first upper repetition array 811, the first lower repetition array 812 is controlled to be repeated for the first number of repetitions in the first direction ox to fill the second blank region 92 located between the third translation array 30 and the first lower repetition array 812, the second left repetition array 821 is controlled to be repeated for the second number of repetitions in the second direction oy to fill the third blank region 93 located between the second left repetition array 821 and the third translation array 30, the second right repetition array 822 is controlled to be repeated for the second number of repetitions in the second direction oy to fill the fourth blank region 94 located between the second right repetition array 822 and the second translation array 20, and the third repetition array 83 is controlled to be repeated for the first number of repetitions in the first direction ox and the repeated graph is repeated for the second number of repetitions in the second direction oy to fill the fifth blank region 95, to obtain the target expanded storage array 300 as shown in FIG. 4A. By dividing the initial array 100 into corner arrays and repetition arrays, using the three corner arrays as translation arrays, and pre-translating the three corner arrays to obtain a target expanded storage array including blank regions, and filling the outline by repeating the repetition arrays, the target expanded storage array 300 is obtained. The optical proximity correction of the corner arrays is avoided to be different, so as to improve the yield and quality of the semiconductor memory products.

In other embodiments, the third repetition array may be separately repeated for a target number of repetitions to fill the fifth blank region, and the target number of repetitions= (the first number of repetitions+1)×(the second number of repetitions+1)−1.

Figure 3C:
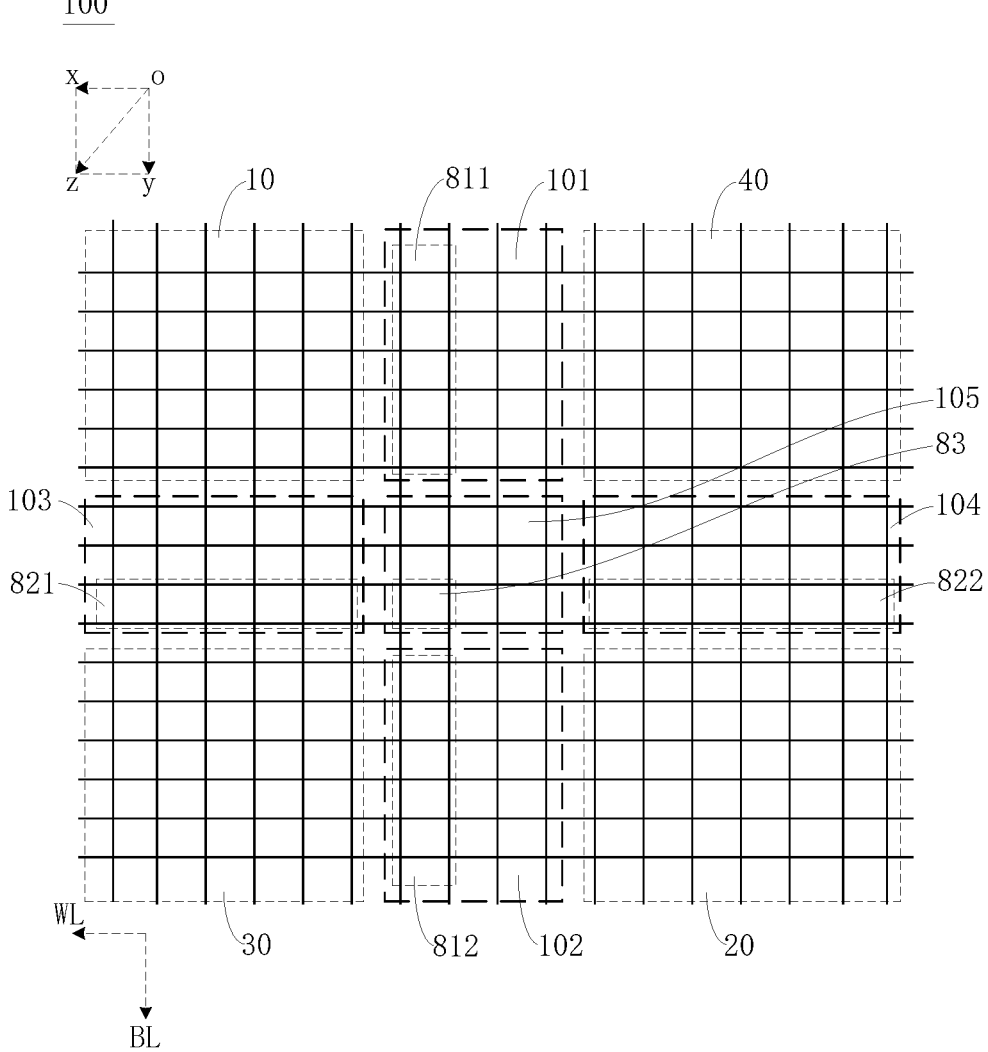
FIG. 3C illustrates a schematic top view of an initial array according to another embodiment of the disclosure.
Figure 3D:
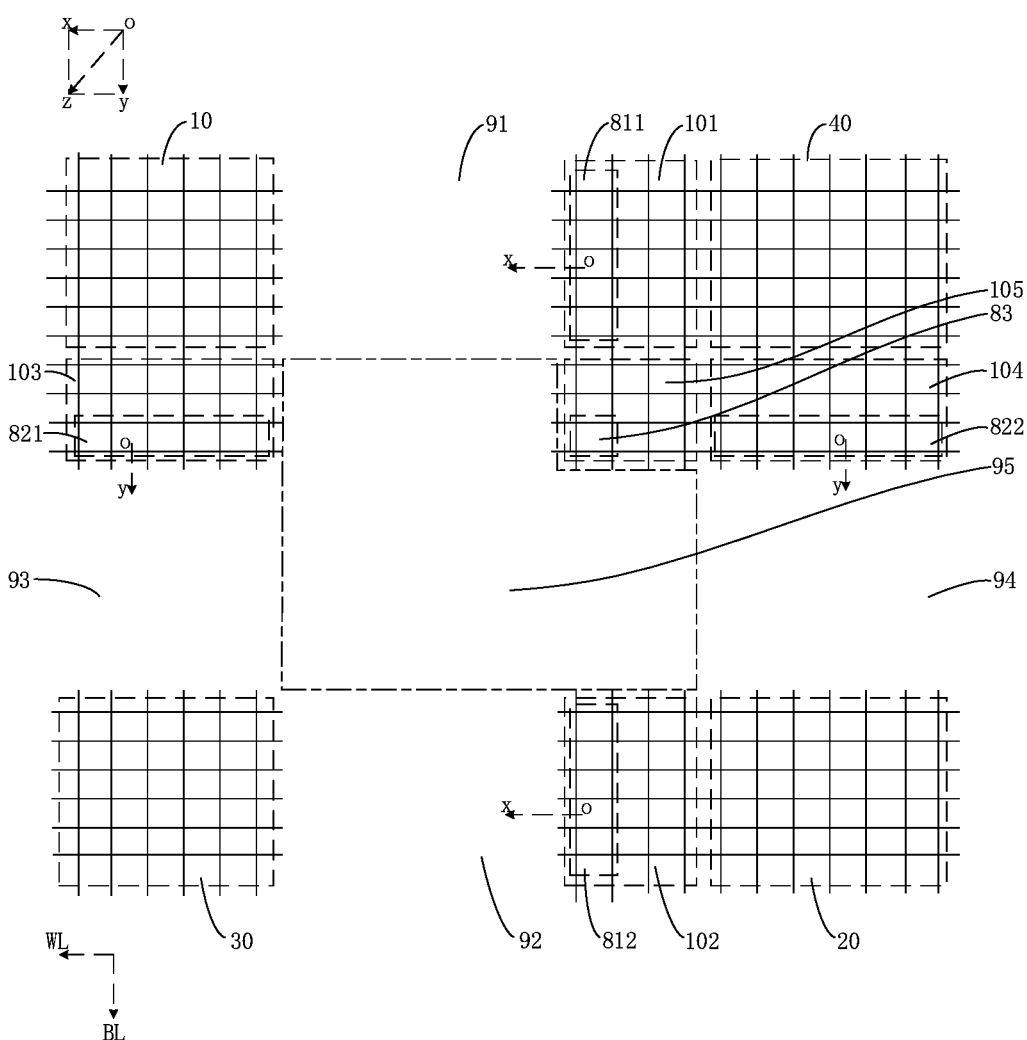
FIG. 3D illustrates a schematic top view of the outline of a target expanded storage array according to another embodiment of the disclosure.

As an example, referring to FIG. 3C and FIG. 3D, the translation array is a corner array of the initial array 100, and the initial array 100 is composed of the translation array and an intermediate array. The translation array includes a first translation array 10, a second translation array 20, a third translation array 30, and a fourth translation array 40. The intermediate array includes a first intermediate array 101, a second intermediate array 102, a third intermediate array 103, a fourth intermediate array 104, and a fifth intermediate array 105. The first intermediate array 101 is located between the first translation array 10 and the fourth translation array 40. The second intermediate array 102 is located between the second translation array 20 and the third translation array 30. The third intermediate array 103 is located between the first translation array 10 and the third translation array 30. The fourth intermediate array 104 is located between the second translation array 20 and the fourth translation array 40. The first intermediate array 101, the second intermediate array 102, the third intermediate array 103, and the fourth intermediate array 104 are arranged surrounding the fifth intermediate array 105. The repetition array includes a first repetition array, a second repetition array, and a third repetition array 83. The first repetition array includes a first upper repetition array 811 and a first lower repetition array 812. The second repetition array includes a second left repetition array 821, a second right repetition array 822, and the third repetition array 83. The first upper repetition array 811 is located in the first intermediate array 101 and at the side of the first intermediate array 101 close to the first translation array 10. A length of the first upper repetition array 811 in the first direction ox is less than a length of the first intermediate array 101 in the first direction ox. A width of the first upper repetition array 811 in the first direction ox is equal to a width of the first intermediate array 101 in the first direction ox. The first lower repetition array 812 is located in the second intermediate array 102 and at the side of the second intermediate array 102 close to the third translation array 30. A length of the first lower repetition array 812 in the first direction ox is less than a length of the second intermediate array 102 in the first direction ox. A width of the first lower repetition array 812 in the first direction ox is equal to a width of the second intermediate array 102 in the first direction ox. The second left repetition array 821 is located in the third intermediate array 103 and at the side of the third intermediate array 103 close to the third translation array 30. A length of the second left repetition array 821 in the second direction oy is less than a length of the third intermediate array 103 in the second direction oy. A width of the second left repetition array 821 in the second direction oy is equal to a width of the third intermediate array 103 in the second direction oy. The second right repetition array 822 is located in the fourth intermediate array 104 and at the side of the fourth intermediate array 104 close to the second translation array 20. A length of the second right repetition array 822 in the second direction oy is less than a length of the fourth intermediate array 104 in the second direction oy. A width of the second right repetition array 822 in the second direction oy is equal to a width of the fourth intermediate array 104 in the second direction oy. The third repetition array 83 is located in a region of the fifth intermediate array 105 close to the third intermediate array 103 and the second intermediate array 102. A length of the third repetition array 83 in the first direction ox is less than a length of the fifth intermediate array 105 in the first direction ox. A length of the third repetition array 83 in the second direction oy is less than a length of the fifth intermediate array 105 in the second direction oy. The translation amount of the translation array in the translation direction may be calculated according to the following formulae:

$$stretch\_x=(Nbitline-Ncornerb-Nmiddleb)*bitlinepitch;\ and$$

$$stretch\_y=(Nwordline-Ncornerw-Nmiddlew)*wordline\_pitch.$$

In the formulae above, stretch_x is the first-direction translation amount of the first translation array 10 in the first direction ox, stretch_y is the second-direction translation amount of the second translation array 20 in the second direction oy, Nwordline is the total number of word lines of the target expanded storage array, Ncornerw is the total number of word lines of the translation array, Nbitline is the total number of bit lines of the target expanded storage array, Ncornerb is the total number of bit lines of the translation array, Nmiddleb is the total number of bit lines of the intermediate array, Nmiddlew is the total number of word lines of the intermediate array, wordline_pitch is the word line pitch, and bitline_pitch is the bit line pitch.

Furthermore, the number of repetitions of the repetition array in the corresponding repetition direction may be calculated according to the following formulae:

$$repetition\_x=(Nrbitline-Ncornerb-Nmiddleb)/Nb;\ and$$

$$repetition\_y=(Nrwordline-Ncornerw-Nmiddlew)/Nw.$$

In the formulae, repetition_x is the first number of repetitions of the first repetition array in the first direction ox, repetition_y is the second number of repetitions of the second repetition array in the second direction oy, Nb is the number of bit lines in the first repetition array, Nw is the number of word lines in the second repetition array, Nrwordline is the total number of word lines of the target expanded storage array, Nrbitline is the total number of bit lines of the target expanded storage array, Nmiddleb is the total number of bit lines of the intermediate array, Nmiddlew is the total number of word lines of the intermediate array, Ncornerw is the total number of word lines of the translation array, and Ncornerb is the total number of bit lines of the translation array.

Furthermore, still referring to FIG. 3C and FIG. 3D, after controlling the first translation array 10 and the third intermediate array 103 to translate by the first-direction translation amount stretch_x in the first direction ox, and controlling the second translation array 20 and the second intermediate array 102 to translate by the second-direction translation amount stretch_y in the second direction oy, the third translation array 30 is controlled to translate by a third-direction translation amount in the third direction oz, to obtain the target expanded storage array including the blank region as shown in FIG. 3D. The third-direction translation amount is a vector sum of the first-direction translation amount and the second-direction translation amount. The first direction ox may be set to be consistent with an extension direction (WL) of word lines, and the second direction oy may be set to be consistent with an extension direction (BL) of bit lines.

Figure 4B:
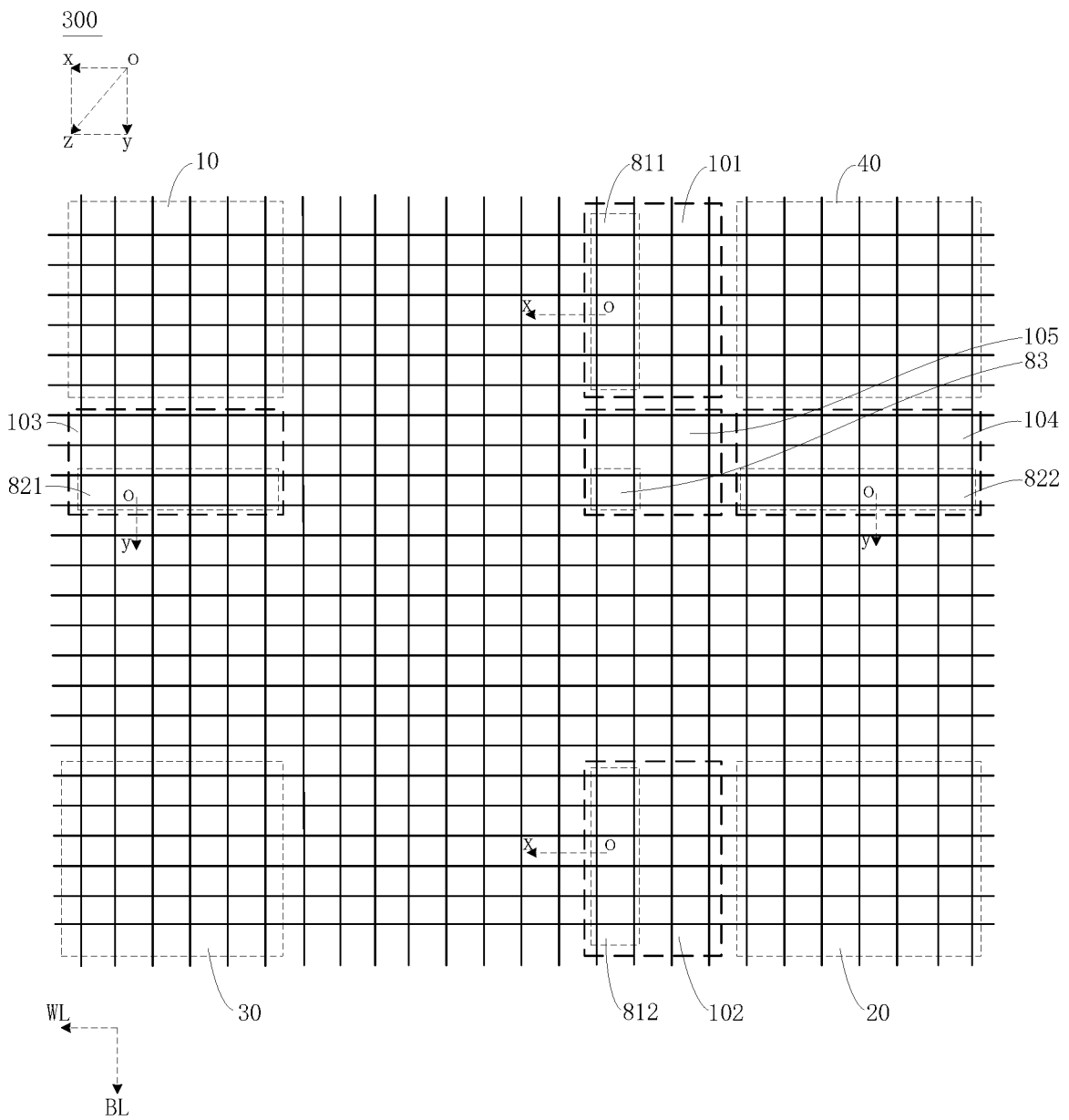
FIG. 4B illustrates a schematic top view of a target expanded storage array according to another embodiment of the disclosure.

Furthermore, referring to FIG. 3D and FIG. 4B, the first upper repetition array 811 is controlled to be repeated for the first number of repetitions repetition_x in the first direction ox to fill the first blank region 91 located between the first translation array 10 and the first intermediate array 101, the first lower repetition array 812 is controlled to repeat for the first number of repetitions repetition_x in the first direction ox to fill the second blank region 92 located between the third translation array 30 and the second intermediate array 102, the second left repetition array 821 is controlled to repeat for the second number of repetitions repetition_y in the second direction oy to fill the third blank region 93 located between the second left repetition array 821 and the third translation array 30, and the second right repetition array 822 is controlled to repeat for the second number of repetitions repetition_y in the second direction oy to fill the fourth blank region 94 located between the second right repetition array 822 and the second translation array 20.

Since the fifth blank region 95 has an irregular shape, various repetition strategies may be adopted to repeat the third repetition array 83 to fill the fifth blank region 95. The following describes the number of repetitions for which the third repetition array 83 needs to be repeated in different directions by taking separate repetition of the third repetition array 83 as an example. Since the third repetition array 83 has a maximum length of (Nrbitline−Ncornerb)*bitline_pitch in the first direction ox, and has a maximum length (Nwordline−Ncornerw)*wordline_pitch in the second direction oy, assuming that the length of the third repetition array 83 in the first direction ox is equal to the length of the first upper repetition array 811 in the first direction ox, and the length of the third repetition array 83 in the second direction oy is equal to the length of the second right repetition array 822 in the second direction oy, a maximum number of repetitions of the third repetition array 83 in the first direction ox is equal to repetition_xmax= (Nrbitline−Ncornerb)/Nb, a maximum number of repetitions of the third repetition array 83 in the second direction oy is equal to repetition_ymax=(Nrwordline−Ncornerw)/Nw, and a total number of repetitions in the fifth blank region 95 is equal to repetition_xmax*repetition_ymax− (Nmiddleb*Nmiddlew)/Nb*Nw.

In other embodiments, the third repetition array 83 may also be firstly controlled to first fill the blank between the fifth intermediate array 105 and the third intermediate array 103, and then a part having the length of (Nrbitline−Ncornerb)*bitline_pitch in the first direction ox and a length of Nw*wordline_pitch in the second direction oy as the fourth repetition array to repeat in the second direction oy to fill the fifth blank region 95. It may be understood that the length of the fourth repetition array in the second direction oy is the same as the length of the third repetition array in the second direction oy. Similarly, the third repetition array

83 may also be firstly controlled to fill the blank between the fifth intermediate array 105 and the second intermediate array 102, and the newly defined fourth repetition array with a longer length in the second direction is repeated in the first direction ox, to fill the fifth blank region 95.

The reasons for using part of the intermediate array as the repetition array include but are not limited to: the translation amount of the translation array in the first direction ox or the second direction oy is not an integer multiple of the length of the corresponding intermediate array in this direction, and directly using the intermediate array for repetition may cause overlap.

Figure 5:
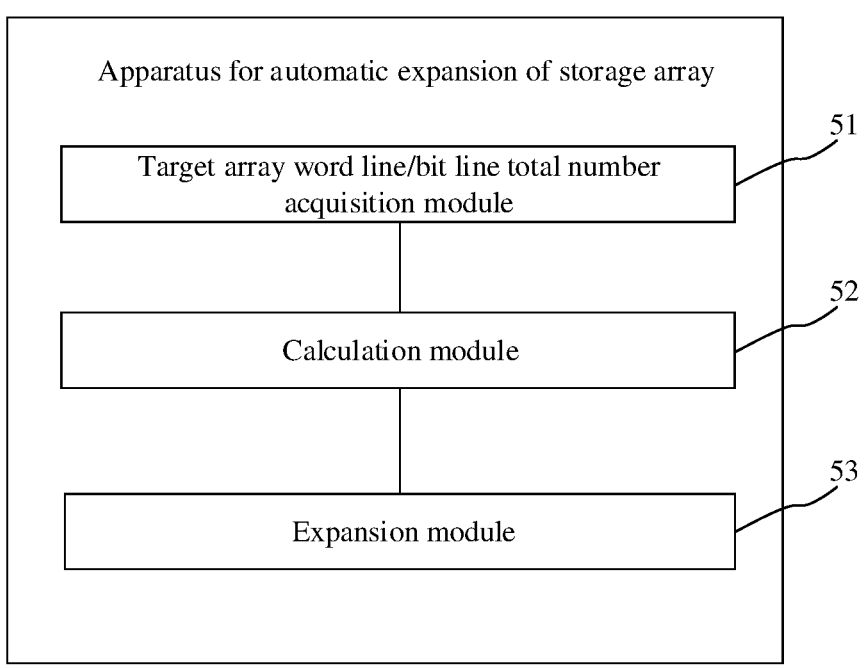
FIG. 5 illustrates a schematic structural diagram of an apparatus for automatic expansion of a storage array according to an embodiment of the disclosure.

Referring to FIG. 5, in one embodiment of the disclosure, an apparatus 50 for automatic expansion of a storage array is provided. The apparatus 50 for automatic expansion of a storage array includes: a target array word line/bit line total number acquisition module 51, a calculation module 52, and an expansion module 53. The target array word line/bit line total number acquisition module 51 is configured to acquire a total number of word lines of a target expanded storage array and a total number of bit lines of the target expanded storage array. The calculation module 52 is configured to calculate a translation amount of a translation array in a translation direction according to the total number of word lines of the target expanded storage array, the total number of bit lines of the target expanded storage array, a total number of word lines of the translation array, a total number of bit lines of the translation array, and a preset translation rule, and calculate a number of repetitions of a repetition array in a repetition direction according to the translation amount, a total number of word lines of the repetition array, a total number of bit lines of the repetition array, and a preset repetition rule. The expansion module 53 is configured to control at least part of the translation array and at least part of the repetition array to translate by a corresponding translation amount along the translation direction, and control the repetition array to repeat for the number of repetitions along the repetition direction, to obtain the target expanded storage array. Since this embodiment may automatically generate a target expanded storage array according to the total number of word lines of the target expanded storage array and the total number of bit lines of the target expanded storage array, it is realized that the target expanded storage array is automatically and efficiently generated according to the required storage capacity. Errors such as unclear boundaries or coordinate offsets in the process of manually expanding the storage array are avoided, thereby effectively improving the production efficiency and quality of semiconductor storage products.

Figure 6:
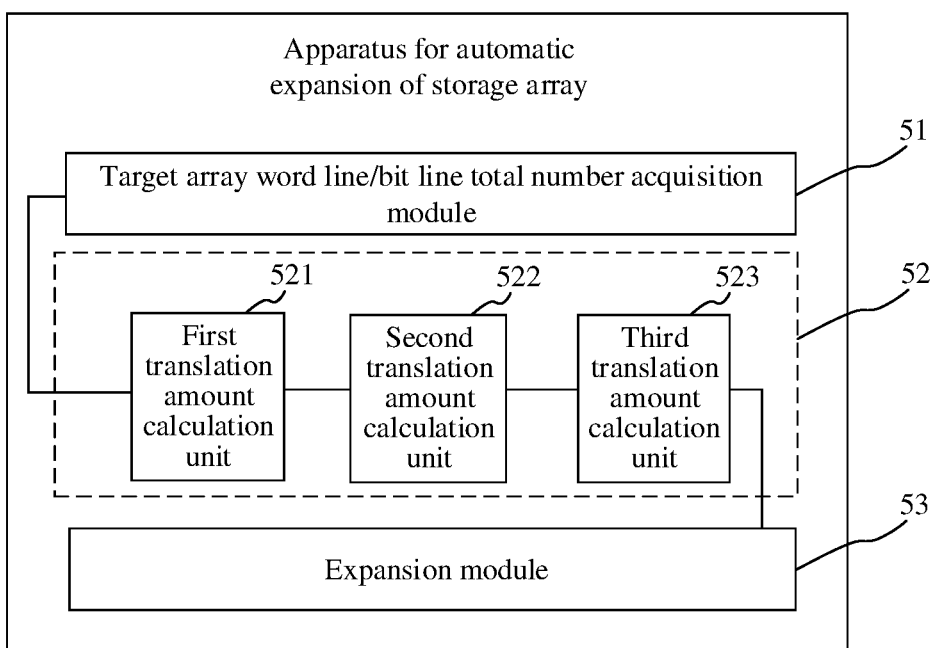
FIG. 6 illustrates a schematic structural diagram of an apparatus for automatic expansion of a storage array according to another embodiment of the disclosure.

As an example, referring to FIG. 6, the translation array includes a first translation array defined to translate in a first direction, a second translation array defined to translate in a second direction, and a third translation array defined to translate in the first direction and the second direction. The calculation module 52 includes a first translation amount calculation unit 521, a second translation amount calculation unit 522, and a third translation amount calculation unit 523. The first translation amount calculation unit 521 is configured to calculate a first-direction translation amount of the first translation array in the first direction according to a difference between the total number of bit lines of the target expanded storage array and the total number of bit lines of the translation array. The second translation amount calculation unit 522 is configured to calculate a second-direction translation amount of the second translation array in the second direction according to a difference between the total number of word lines of the target expanded storage array and the total number of word lines of the translation array. The third translation amount calculation unit 523 is configured to use a vector sum of the first-direction translation amount and the second-direction translation amount as a third-direction translation amount of the third translation array. By controlling the first translation array and part of the repetition array to translate by the first-direction translation amount along the first direction, controlling the second translation array and part of the repetition array to translate by the second-direction translation amount along the second direction, and controlling the third translation array to translate by the third-direction translation amount along a vector sum direction of the first direction and the second direction, it is realized that a target expanded storage array including a blank region is obtained by translating according to at least part of the translation array and at least part of the repetition array, so that the blank region may be filled by repeating the repetition array, so as to obtain the target expanded storage array.

Figure 7:
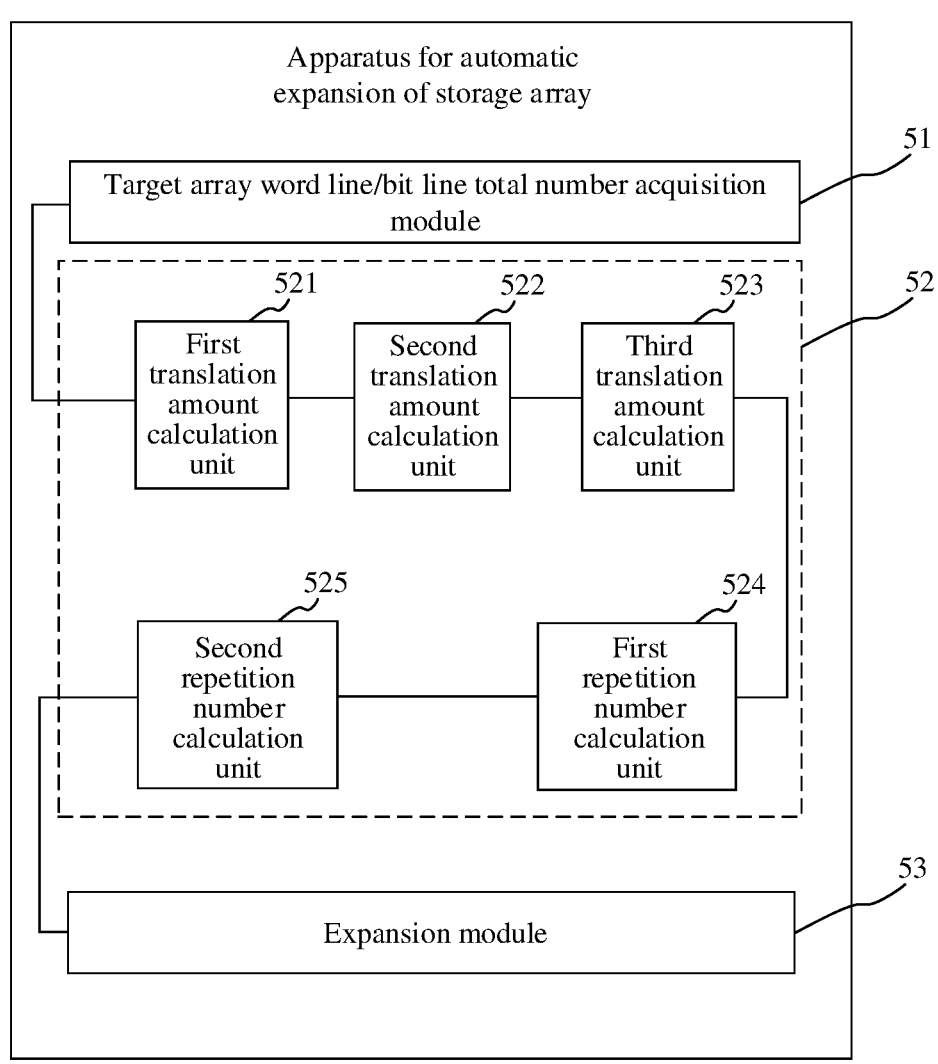
FIG. 7 illustrates a schematic structural diagram of an apparatus for automatic expansion of a storage array according to yet another embodiment of the disclosure.

As an example, referring to FIG. 7, the repetition array includes a first repetition array to be repeated in the first direction, a second repetition array to be repeated in the second direction, and a third repetition array to be repeated in the first direction and the second direction. The calculation module 52 further includes a first repetition number calculation unit 524 and a second repetition number calculation unit 525. The first repetition number calculation unit 524 is configured to calculate a first number of repetitions of the first repetition array and the third repetition array in the first direction according to the difference between the total number of bit lines of the target expanded storage array and the total number of bit lines of the translation array. The second repetition number calculation unit 525 is configured to calculate a second number of repetitions of the second repetition array and the third repetition array in the second direction according to the difference between the total number of word lines of the target expanded storage array and the total number of word lines of the translation array. After translating according to at least part of the translation array and at least part of the repetition array to obtain the target expanded storage array including the blank region, the number of repetitions of the repetition array is calculated according to the size of the blank region and the size of the repetition array, to implement intelligent precise filling of the blank region, thereby avoiding errors such as boundary overlap or coordinate offsets in the target expanded storage array.

Figure 8:
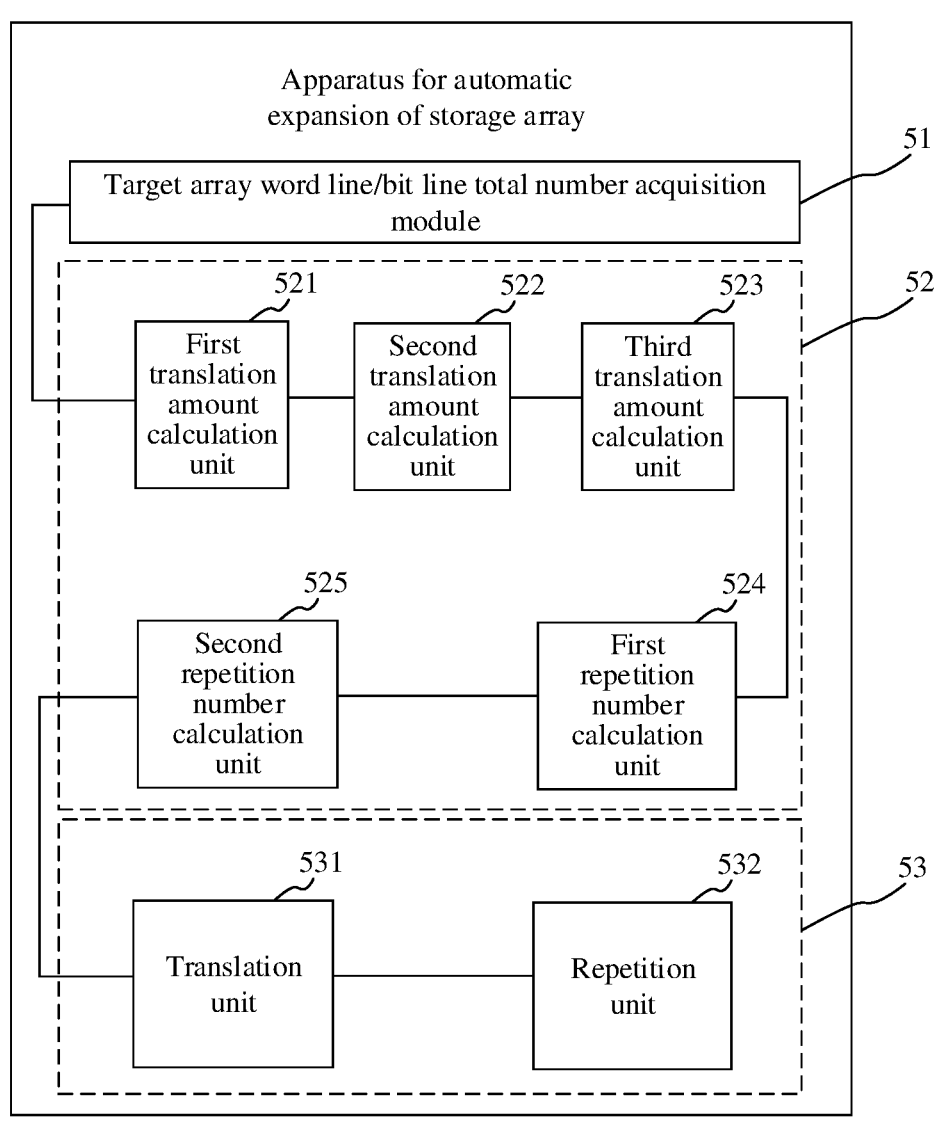
FIG. 8 illustrates a schematic structural diagram of an apparatus for automatic expansion of a storage array according to still another embodiment of the disclosure.

As an example, referring to FIG. 8, the expansion module 53 includes a translation unit 531 and a repetition unit 532. The translation unit 531 is configured to control the first translation array and part of the repetition array to translate by the first-direction translation amount along the first direction, control the second translation array and part of the repetition array to translate by the second-direction translation amount along the second direction, and control the third translation array to translate by the third-direction translation amount along a vector sum direction of the first direction and the second direction. The repetition unit 532 is configured to control the first repetition array to repeat for the first number of repetitions along the first direction, control the second repetition array to repeat for the second number of repetitions along the second direction, and control the third repetition array to repeat for the first number of repetitions along the first direction and to repeat for the second number of repetitions along the second direction. After translating according to at least part of the translation array and at least part of the repetition array to obtain the target expanded storage array including the blank region, the number of repetitions of the repetition array is calculated according to the size of the blank region and the size of the repetition array, to implement intelligent precise filling of the blank region, thereby avoiding errors such as boundary overlap or coordinate offsets in the target expanded storage array.

As an example, the translation array includes a corner array of the target expanded storage array. The first direction is consistent with an extension direction of word lines, and the second direction is consistent with an extension direction of bit lines, to realize automatic expansion according to the extension direction of word lines and the extension direction of bit lines to form a target expanded storage array, thereby satisfying the capacity requirements of the storage array.

In one embodiment of the disclosure, provided is a computer device, including a memory and a processor. The memory stores a computer program executable on the processor. The computer program, when executed by the processor, causes the processor to implement steps of the method of any embodiment in the disclosure.

In one embodiment of the disclosure, provided is a computer-readable storage medium having a computer program stored thereon that, when executed by a processor, causes the processor to implement steps of the method of any embodiment in the disclosure.

Although steps in the flowcharts of FIG. 1 and FIG. 2 are displayed in sequence according to arrows, these steps are not necessarily performed in the sequence indicated by the arrows. Unless otherwise explicitly specified herein, execution of these steps is not strictly limited, and these steps may be performed in other sequences. Moreover, although at least some of the steps in FIG. 1 and FIG. 2 may include multiple sub-steps or multiple stages. These sub-steps or stages are not necessarily completed at the same moment, but may be performed at different moments. Besides, these sub-steps or stages may not be necessarily performed sequentially, but may be performed in turn or alternately with other steps or at least some of sub-steps or stages of other steps.

Those skilled in the art may understand that all or some of the procedures of the methods of the foregoing embodiments may be implemented by computer programs instructing relevant hardware. The computer program may be stored in a non-volatile computer-readable storage medium. When the computer program is executed, the procedures of the embodiments of the foregoing methods may be included. References to the memory, the storage, the database, or other media used in the embodiments provided in the disclosure may all include a non-volatile memory or a volatile memory.

Note that the foregoing embodiments are for illustrative purposes only and are not intended to limit the disclosure.

Various embodiments in the description are described in a progressive manner, and each embodiment focuses on the differences from other embodiments, and the same and similar parts between the various embodiments may be referred to each other.

The technical features in the foregoing embodiments may be randomly combined. For concise description, not all possible combinations of the technical features in the embodiments are described. However, without conflict, the combinations of the technical features should be considered as falling within the scope described in this specification.

The foregoing embodiments show only several implementations of the disclosure and are described in detail, which, however, are not to be construed as a limitation to the patent scope of the disclosure. For those skilled in the art, several transformations and improvements can be made without departing from the idea of the disclosure. These transformations and improvements belong to the protection scope of the disclosure. Therefore, the protection scope of the patent of the disclosure shall be subject to the appended claims.

The invention claimed is:

1. A method for automatic expansion of a storage array, comprising:
    acquiring a total number of word lines of a target expanded storage array and a total number of bit lines of the target expanded storage array;
    calculating a translation amount of a translation array in a translation direction according to the total number of word lines, the total number of bit lines, a total number of word lines of the translation array, a total number of bit lines of the translation array, and a preset translation rule, and calculating a number of repetitions of a repetition array in a repetition direction according to the translation amount, a total number of word lines of the repetition array, a total number of bit lines of the repetition array, and a preset repetition rule; and
    controlling at least part of the translation array and at least part of the repetition array to translate by the translation amount along the translation direction, and controlling the repetition array to repeat for the number of repetitions along the repetition direction, to obtain the target expanded storage array.

2. The method of claim 1, wherein the translation array comprises a first translation array defined to translate in a first direction, a second translation array defined to translate in a second direction, and a third translation array defined to translate in the first direction and the second direction; and the calculating a translation amount of a translation array in a translation direction comprises:
    calculating a first-direction translation amount of the first translation array in the first direction according to a difference between the total number of bit lines of the target expanded storage array and the total number of bit lines of the translation array;
    calculating a second-direction translation amount of the second translation array in the second direction according to a difference between the total number of word lines of the target expanded storage array and the total number of word lines of the translation array; and
    using a vector sum of the first-direction translation amount and the second-direction translation amount as a third-direction translation amount of the third translation array.

3. The method of claim 2, wherein the calculating a translation amount of a translation array in a translation direction further comprises:
    determining a word line pitch and a bit line pitch of the storage array, wherein the word line pitch is an average distance between two adjacent word lines, and the bit line pitch is an average distance between two adjacent bit lines; and
    calculating the first-direction translation amount stretch_x and the second-direction translation amount stretch_y according to the following formulae:

$$stretch\_x = (Nbitline - Ncornerb) * bitline\_pitch; \text{ and}$$

$$stretch\_y = (Nwordline - Ncornerw) * wordline\_pitch;$$

in the formulae, Nwordline is the total number of word lines of the target expanded storage array, Ncornerw is the total number of word lines of the translation array, Nbitline is the total number of bit lines of the target expanded storage array, Ncornerb is the total number of bit lines of the translation array, wordline_pitch is the word line pitch, and bitline_pitch is the bit line pitch.

4. The method of claim 2, wherein after controlling at least part of the translation array and at least part of the repetition array to translate by the translation amount along the translation direction, the repetition array is controlled to repeat for the number of repetitions along the repetition direction.

5. The method of claim 2, wherein the repetition array comprises a first repetition array to be repeated in the first direction, a second repetition array to be repeated in the second direction, and a third repetition array to be repeated in a vector sum direction of the first direction and the second direction; and the calculating a number of repetitions of a repetition array in a repetition direction comprises:

calculating a first number of repetitions of the first repetition array and the third repetition array in the first direction according to the difference between the total number of bit lines of the target expanded storage array and the total number of bit lines of the translation array; and calculating a second number of repetitions of the second repetition array and the third repetition array in the second direction according to the difference between the total number of word lines of the target expanded storage array and the total number of word lines of the translation array.

6. The method of claim 5, wherein the calculating the first number of repetitions and the second number of repetitions further comprises:

determining a number of bit lines Nb in the first repetition array and a number of word lines Nw in the second repetition array; and calculating the first number of repetitions repetition_x and the second number of repetitions repetition_y according to the following formulae:

$$\text{repetition\_x} = ((Nr\text{bitline} - N\text{corner}b)/Nb) - 1; \text{ and}$$

$$\text{repetition\_y} = ((Nr\text{wordline} - N\text{corner}w)/Nw) - 1;$$

in the formulae, Nrwordline is the total number of word lines of the target expanded storage array, Nrbitline is the total number of bit lines of the target expanded storage array, Ncornerw is the total number of word lines of the translation array, and Ncornerb is the total number of bit lines of the translation array.

7. The method of claim 1, wherein the translation array comprises a corner array of the target expanded storage array.

8. The method of claim 7, wherein the translation array is a corner array of an initial array, and the translation array and the repetition array together form the initial array; and the repetition array is located between adjacent translation arrays.

9. The method of claim 7, wherein the translation array is a corner array of an initial array, and the initial array is composed of the translation array and an intermediate array; and a length of the repetition array in the repetition direction is less than a length of the intermediate array in the repetition direction, and a width of the repetition array in the repetition direction is equal to a width of the intermediate array in the repetition direction.

10. The method of claim 2, wherein:

the first direction is consistent with an extension direction of word lines; and the second direction is consistent with an extension direction of bit lines.

11. A computer device, comprising a memory and a processor, the memory storing a computer program that, when executed by the processor, causes the processor to implement following:

acquiring a total number of word lines of a target expanded storage array and a total number of bit lines of the target expanded storage array;

calculating a translation amount of a translation array in a translation direction according to the total number of word lines, the total number of bit lines, a total number of word lines of the translation array, a total number of bit lines of the translation array, and a preset translation rule, and calculating a number of repetitions of a repetition array in a repetition direction according to the translation amount, a total number of word lines of the repetition array, a total number of bit lines of the repetition array, and a preset repetition rule; and controlling at least part of the translation array and at least part of the repetition array to translate by the translation amount along the translation direction, and controlling the repetition array to repeat for the number of repetitions along the repetition direction, to obtain the target expanded storage array.

12. The computer device of claim 11, wherein the translation array comprises a first translation array defined to translate in a first direction, a second translation array defined to translate in a second direction, and a third translation array defined to translate in the first direction and the second direction; and in calculating a translation amount of a translation array in a translation direction, the processor is caused to implement:

calculating a first-direction translation amount of the first translation array in the first direction according to a difference between the total number of bit lines of the target expanded storage array and the total number of bit lines of the translation array;

calculating a second-direction translation amount of the second translation array in the second direction according to a difference between the total number of word lines of the target expanded storage array and the total number of word lines of the translation array; and using a vector sum of the first-direction translation amount and the second-direction translation amount as a third-direction translation amount of the third translation array.

13. The computer device of claim 12, wherein in calculating a translation amount of a translation array in a translation direction, the processor is caused to implement:

determining a word line pitch and a bit line pitch of the storage array, wherein the word line pitch is an average distance between two adjacent word lines, and the bit line pitch is an average distance between two adjacent bit lines; and calculating the first-direction translation amount stretch_x and the second-direction translation amount stretch_y according to the following formulae:

$$\text{stretch\_x} = (N\text{bitline} - N\text{corner}b) * \text{bitline\_pitch}; \text{ and}$$

$$\text{stretch\_y} = (N\text{wordline} - N\text{corner}w) * \text{wordline\_pitch};$$

in the formulae, Nwordline is the total number of word lines of the target expanded storage array, Ncornerw is the total number of word lines of the translation array, Nbitline is the total number of bit lines of the target expanded storage array, Ncornerb is the total number of bit lines of the translation array, wordline_pitch is the word line pitch, and bitline_pitch is the bit line pitch.

14. The computer device of claim 12, wherein after controlling at least part of the translation array and at least part of the repetition array to translate by the translation amount along the translation direction, the repetition array is controlled to repeat for the number of repetitions along the repetition direction.

15. The computer device of claim 12, wherein the repetition array comprises a first repetition array to be repeated in the first direction, a second repetition array to be repeated in the second direction, and a third repetition array to be repeated in a vector sum direction of the first direction and the second direction; and in calculating a number of repetitions of a repetition array in a repetition direction, the processor is caused to implement:

calculating a first number of repetitions of the first repetition array and the third repetition array in the first direction according to the difference between the total number of bit lines of the target expanded storage array and the total number of bit lines of the translation array; and calculating a second number of repetitions of the second repetition array and the third repetition array in the second direction according to the difference between the total number of word lines of the target expanded storage array and the total number of word lines of the translation array.

16. The computer device of claim 15, wherein in calculating the first number of repetitions and the second number of repetitions, the processor is caused to implement:

determining a number of bit lines Nb in the first repetition array and a number of word lines Nw in the second repetition array; and calculating the first number of repetitions repetition_x and the second number of repetitions repetition_y according to the following formulae:

$$repetition\_x = ((Nrbitline - Ncornerb)/Nb) - 1; \text{ and}$$

$$repetition\_y = ((Nrwordline - Ncornerw)/Nw) - 1;$$

in the formulae, Nrwordline is the total number of word lines of the target expanded storage array, Nrbitline is the total number of bit lines of the target expanded storage array, Ncornerw is the total number of word lines of the translation array, and Ncornerb is the total number of bit lines of the translation array.

17. The computer device of claim 11, wherein the translation array comprises a corner array of the target expanded storage array.

18. The computer device of claim 17, wherein the translation array is a corner array of an initial array, and the translation array and the repetition array together form the initial array; and the repetition array is located between adjacent translation arrays.

19. The computer device of claim 17, wherein the translation array is a corner array of an initial array, and the initial array is composed of the translation array and an intermediate array; and a length of the repetition array in the repetition direction is less than a length of the intermediate array in the repetition direction, and a width of the repetition array in the repetition direction is equal to a width of the intermediate array in the repetition direction.

20. A non-transitory computer-readable storage medium having stored thereon a computer program that, when executed by a processor, causes the processor to implement:

acquiring a total number of word lines of a target expanded storage array and a total number of bit lines of the target expanded storage array;

calculating a translation amount of a translation array in a translation direction according to the total number of word lines, the total number of bit lines, a total number of word lines of the translation array, a total number of bit lines of the translation array, and a preset translation rule, and calculating a number of repetitions of a repetition array in a repetition direction according to the translation amount, a total number of word lines of the repetition array, a total number of bit lines of the repetition array, and a preset repetition rule; and controlling at least part of the translation array and at least part of the repetition array to translate by the translation amount along the translation direction, and controlling the repetition array to repeat for the number of repetitions along the repetition direction, to obtain the target expanded storage array.

* * * * *